United States Patent
Kwak

(10) Patent No.: US 11,534,909 B2
(45) Date of Patent: Dec. 27, 2022

(54) DISPLAYING METHOD OF ROBOT SIMULATOR

(71) Applicant: LG ELECTRONICS INC., Seoul (KR)

(72) Inventor: Hoseong Kwak, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 608 days.

(21) Appl. No.: 16/562,924

(22) Filed: Sep. 6, 2019

(65) Prior Publication Data

US 2019/0389061 A1 Dec. 26, 2019

(30) Foreign Application Priority Data

Jul. 12, 2019 (KR) .................. 10-2019-0084787

(51) Int. Cl.
  *B25J 9/16* (2006.01)
  *G06N 20/00* (2019.01)
  *G06F 30/20* (2020.01)

(52) U.S. Cl.
  CPC ........... *B25J 9/1605* (2013.01); *B25J 9/1671* (2013.01); *G06F 30/20* (2020.01); *G06N 20/00* (2019.01)

(58) Field of Classification Search
  CPC ....... B25J 9/1605; B25J 9/1671; G06F 30/20; G06N 20/00; G06N 3/08
  See application file for complete search history.

(56) References Cited

U.S. PATENT DOCUMENTS

| | | | |
|---|---|---|---|
| 2014/0236565 A1* | 8/2014 | Kuwahara | B25J 9/1671 703/22 |
| 2015/0231785 A1* | 8/2015 | Suga | B25J 9/1671 700/250 |
| 2018/0036883 A1* | 2/2018 | Nishitani | B25J 9/1671 |
| 2018/0297202 A1* | 10/2018 | Nishitani | G06F 30/20 |
| 2020/0101599 A1* | 4/2020 | Yoshida | B25J 9/1674 |

\* cited by examiner

*Primary Examiner* — Jason Holloway
(74) *Attorney, Agent, or Firm* — Birch, Stewart, Kolasch & Birch, LLP

(57) ABSTRACT

A displaying method of a robot simulator for intuitively recognizing the working direction of a tool is provided. A displaying method on a robot simulator includes displaying a real image of a robot to mount a tool at an end effector of a robot arm, displaying a tool coordinate system indicating an operating direction of the tool at the end effector of the robot arm which is displayed in the displaying of the real image of the robot, displaying a virtual reality (VR) image having a three-dimension image at the end effector of the robot arm which is displayed in the displaying of the real image of the robot.

14 Claims, 8 Drawing Sheets

DISPLAYING METHOD OF ROBOT SIMULATOR

CROSS-REFERENCE TO RELATED APPLICATIONS

This application is based on and claims priority under 35 U.S.C. § 119 and 35 U.S.C. § 365 to Korean Patent Application No. 10-2019-0084787, filed on Jul. 12, 2019, in the Korean Intellectual Property Office, the disclosure of which is incorporated by reference herein its entirety.

BACKGROUND

The present disclosure relates to a displaying method of a robot simulator for intuitively recognizing the working direction of a tool.

With the development of a robot technology, automation using robots is significantly progressing, thereby improving work efficiency of processes and increasing productivity.

In order to utilize a robot in an existing industrial site, a method that an operator sets a robot to perform a desired operation while personally identifying the operation of the robot on the spot has been used.

The above method may be performed only by the skilled operator, which makes it difficult to rapidly cope with the work change.

There has been suggested a robot simulator for graphically displaying a 3D model image of a robot on a display device based on 3D Computer Aided Design (CAD) data and manipulating the 3D model image to simulate a robot system.

Japanese Patent Registration No. 6350037 (filed on Jun. 30, 2014) discloses a robot simulator for making a moving picture for simulating the operations of a robot and various devices, for reproducing the moving picture in the form of an animation, and for easily identifying the simulation result.

As the robot is simulated, the operator may verify the work by the robot without actually operating the robot.

In this case, the operator has to input teaching data into the simulator to produce the work of the robot on the robot simulator.

However, in the case of a working robot having a robot arm to mount various tools at an end effector thereof, the operator has to input teaching data based on the working direction of the tool into the robot simulator whenever the tool is changed.

According to the prior art, although the tool coordinate system is displayed on the robot simulator, it is difficult for the operator to intuitively recognize the working direction of the tools whenever various types of tools are applied.

SUMMARY

The present disclosure is to provide a displaying method on a robot simulator for intuitively recognizing the working direction of a tool.

According to an embodiment of the present disclosure, there is provided a displaying method on a robot simulator, including displaying an image of a robot to mount a tool at an end effector of a robot arm, displaying a tool coordinate system indicating an operating direction of the tool at the end effector of the robot arm which is displayed in the displaying of the image of the robot, and displaying a virtual reality (VR) image having a three-dimension image at the end effector of the robot arm which is displayed in the displaying of the image of the robot.

The displaying of the VR image may include displaying the VR image in a form of a hand image to intuitively display a working direction of the tool.

The displaying of the VR image may include displaying the VR image having a length shorter than a whole length of the robot arm, and the VR image may be displayed with the length of 20-25% of the whole length of the robot arm.

The displaying of the VR image may include displaying the VR image having a length equal to or longer than a length of the tool mounted on the robot arm.

The displaying of the VR image may include displaying the VR image such that at least a portion of the VR image overlaps with at last a portion of the tool.

The displaying of the VR image may include displaying the VR image to be linked with the movement of the tool.

The displaying of the VR image may include displaying the hand image such that the hand image overlaps with at least a portion of the tool coordinate system.

The displaying of the tool coordinate system may include displaying the tool coordinate system with an X axis, a Y axis, and a Z axis perpendicular to one another in a three dimension, and setting the Z axis to be a lengthwise direction of the tool.

The displaying of the tool coordinate system may further include matching the tool coordinate system to a direction of the robot arm.

In detail, the X axis may be displayed in a direction that a joint closest to the end effector of the robot arm is folded, the Z axis may be displayed in a direction that the end effector of the robot arm indicates, and the Y axis may be displayed in a direction perpendicular to the X and Y axes.

The displaying of the VR image may further include matching the tool coordinate system to a direction of the hand image.

In detail, a direction that a palm of the hand image indicates may be displayed as the X axis, a direction that a thumb of the hand image indicates may be displayed as the Y axis, and a direction that remaining fingers of the hand image except for the thumb indicate may be displayed as the Z axis.

The displaying of the image may include displaying an end effector of a robot arm to mount a plurality of tools, the displaying of the tool coordinate system may include displaying tool coordinate systems at mounting positions of the tools, respectively, at the end effector of the robot arm which is displayed in the displaying of the image, and the displaying of the tool coordinate system may include displaying VR images at mounting positions of the tools, respectively, at the end effector of the robot arm which is displayed in the displaying of the image.

The displaying method may further include selecting one of the tools to be mounted in the displaying of the image, and the displaying of the tool coordinate system may include displaying only one of the tool coordinate system at an end effector position, at which the selected tool is to be mounted in the selecting of one of the tools, of the robot arm.

The displaying method may further include selecting one of the tools to be mounted in the displaying of the image, and the displaying of the VR image may include displaying one VR image at an end effector position, at which the selected tool is to be mounted in the selecting of one of the tools, of the robot arm.

The displaying of the VR image may include displaying the VR image such that the VR image overlaps with at last a portion of the tool.

The displaying of the VR image may include displaying the VR image to be linked with the movement of the tool.

The displaying of the VR image may include displaying the VR image such that at least a portion of the VR image overlaps with the tool coordinate system.

According to the present disclosure, the robot simulator may display a real image of the robot arm on a display panel, and a tool coordinate system and the 3D-shaped VR image may be displayed at an end effector of the robot arm.

Accordingly, the working direction of the tool to be mounted on the robot arm through the tool coordinate system and the VR image may be intuitively recognized like that a human being works. In addition, the work may be easily indicated without determining the working direction while separately and directly moving the robot arm. Accordingly, the working convenience of the operator may be increased, and the working speed may be increased.

DETAILED DESCRIPTION OF THE EMBODIMENTS

Figure 1:
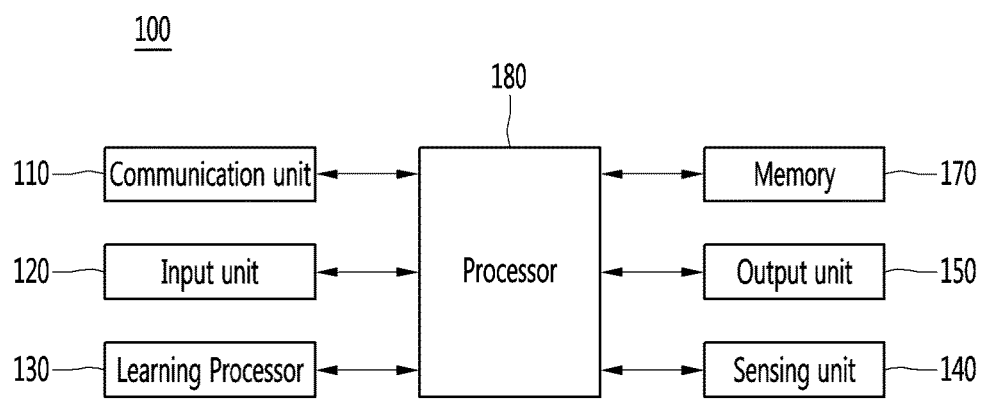
FIG. 1 illustrates an AI apparatus according to an embodiment of the present disclosure.

Hereinafter, the present embodiment will be described in detail with reference to accompanying drawings.

Artificial intelligence refers to the field of studying artificial intelligence or methodology for making artificial intelligence, and machine learning refers to the field of defining various issues dealt with in the field of artificial intelligence and studying methodology for solving the various issues. Machine learning is defined as an algorithm that enhances the performance of a certain task through a steady experience with the certain task.

An artificial neural network (ANN) is a model used in machine learning and may mean a whole model of problem-solving ability which is composed of artificial neurons (nodes) that form a network by synaptic connections. The artificial neural network can be defined by a connection pattern between neurons in different layers, a learning process for updating model parameters, and an activation function for generating an output value.

The artificial neural network may include an input layer, an output layer, and optionally one or more hidden layers. Each layer includes one or more neurons, and the artificial neural network may include a synapse that links neurons to neurons. In the artificial neural network, each neuron may output the function value of the activation function for input signals, weights, and deflections input through the synapse.

Model parameters refer to parameters determined through learning and include a weight value of synaptic connection and deflection of neurons. A hyperparameter means a parameter to be set in the machine learning algorithm before learning, and includes a learning rate, a repetition number, a mini batch size, and an initialization function.

The purpose of the learning of the artificial neural network may be to determine the model parameters that minimize a loss function. The loss function may be used as an index to determine optimal model parameters in the learning process of the artificial neural network.

Machine learning may be classified into supervised learning, unsupervised learning, and reinforcement learning according to a learning method.

The supervised learning may refer to a method of learning an artificial neural network in a state in which a label for learning data is given, and the label may mean the correct answer (or result value) that the artificial neural network must infer when the learning data is input to the artificial neural network. The unsupervised learning may refer to a method of learning an artificial neural network in a state in which a label for learning data is not given. The reinforcement learning may refer to a learning method in which an agent defined in a certain environment learns to select a behavior or a behavior sequence that maximizes cumulative compensation in each state.

Machine learning, which is implemented as a deep neural network (DNN) including a plurality of hidden layers among artificial neural networks, is also referred to as deep learning, and the deep running is part of machine running. In the following, machine learning is used to mean deep running.

A robot may refer to a machine that automatically processes or operates a given task by its own ability. In particular, a robot having a function of recognizing an environment and performing a self-determination operation may be referred to as an intelligent robot.

Robots may be classified into industrial robots, medical robots, home robots, military robots, and the like according to the use purpose or field.

The robot includes a driving unit may include an actuator or a motor and may perform various physical operations such as moving a robot joint. In addition, a movable robot may include a wheel, a brake, a propeller, and the like in a driving unit, and may travel on the ground through the driving unit or fly in the air.

Extended reality is collectively referred to as virtual reality (VR), augmented reality (AR), and mixed reality (MR). The VR technology provides a real-world object and background only as a CG image, the AR technology provides a virtual CG image on a real object image, and the MR technology is a computer graphic technology that mixes and combines virtual objects into the real world.

The MR technology is similar to the AR technology in that the real object and the virtual object are shown together. However, in the AR technology, the virtual object is used in the form that complements the real object, whereas in the MR technology, the virtual object and the real object are used in an equal manner.

The XR technology may be applied to a head-mount display (HMD), a head-up display (HUD), a mobile phone, a tablet PC, a laptop, a desktop, a TV, a digital signage, and the like. A device to which the XR technology is applied may be referred to as an XR device.

FIG. 1 illustrates an AI device 100 according to an embodiment of the present invention.

The AI device 100 may be implemented by a stationary device or a mobile device, such as a TV, a projector, a mobile phone, a smartphone, a desktop computer, a notebook, a digital broadcasting terminal, a personal digital assistant (PDA), a portable multimedia player (PMP), a navigation device, a tablet PC, a wearable device, a set-top box (STB), a DMB receiver, a radio, a washing machine, a refrigerator, a desktop computer, a digital signage, a robot, a vehicle, and the like.

Referring to FIG. 1, the AI device 100 may include a communication unit 110, an input unit 120, a learning processor 130, a sensing unit 140, an output unit 150, a memory 170, and a processor 180.

The communication unit 110 may transmit and receive data to and from external devices such as other AI devices 100a to 100e and the AI server 200 by using wire/wireless communication technology. For example, the communication unit 110 may transmit and receive sensor information, a user input, a learning model, and a control signal to and from external devices.

The communication technology used by the communication unit 110 includes GSM (Global System for Mobile communication), CDMA (Code Division Multi Access), LTE (Long Term Evolution), 5G, WLAN (Wireless LAN), Wi-Fi (Wireless-Fidelity), Bluetooth™, RFID (Radio Frequency Identification), Infrared Data Association (IrDA), ZigBee, NFC (Near Field Communication), and the like.

The input unit 120 may acquire various kinds of data.

At this time, the input unit 120 may include a camera for inputting a video signal, a microphone for receiving an audio signal, and a user input unit for receiving information from a user. The camera or the microphone may be treated as a sensor, and the signal acquired from the camera or the microphone may be referred to as sensing data or sensor information.

The input unit 120 may acquire a learning data for model learning and an input data to be used when an output is acquired by using learning model. The input unit 120 may acquire raw input data. In this case, the processor 180 or the learning processor 130 may extract an input feature by preprocessing the input data.

The learning processor 130 may learn a model composed of an artificial neural network by using learning data. The learned artificial neural network may be referred to as a learning model. The learning model may be used to an infer result value for new input data rather than learning data, and the inferred value may be used as a basis for determination to perform a certain operation.

At this time, the learning processor 130 may perform AI processing together with the learning processor 240 of the AI server 200.

At this time, the learning processor 130 may include a memory integrated or implemented in the AI device 100. Alternatively, the learning processor 130 may be implemented by using the memory 170, an external memory directly connected to the AI device 100, or a memory held in an external device.

The sensing unit 140 may acquire at least one of internal information about the AI device 100, ambient environment information about the AI device 100, and user information by using various sensors.

Examples of the sensors included in the sensing unit 140 may include a proximity sensor, an illuminance sensor, an acceleration sensor, a magnetic sensor, a gyro sensor, an inertial sensor, an RGB sensor, an IR sensor, a fingerprint recognition sensor, an ultrasonic sensor, an optical sensor, a microphone, a lidar, and a radar.

The output unit 150 may generate an output related to a visual sense, an auditory sense, or a haptic sense.

At this time, the output unit 150 may include a display unit for outputting time information, a speaker for outputting auditory information, and a haptic module for outputting haptic information.

The memory 170 may store data that supports various functions of the AI device 100. For example, the memory 170 may store input data acquired by the input unit 120, learning data, a learning model, a learning history, and the like.

The processor 180 may determine at least one executable operation of the AI device 100 based on information determined or generated by using a data analysis algorithm or a machine learning algorithm. The processor 180 may control the components of the AI device 100 to execute the determined operation.

To this end, the processor 180 may request, search, receive, or utilize data of the learning processor 130 or the memory 170. The processor 180 may control the components of the AI device 100 to execute the predicted operation or the operation determined to be desirable among the at least one executable operation.

When the connection of an external device is required to perform the determined operation, the processor 180 may generate a control signal for controlling the external device and may transmit the generated control signal to the external device.

The processor 180 may acquire intention information for the user input and may determine the user's requirements based on the acquired intention information.

The processor 180 may acquire the intention information corresponding to the user input by using at least one of a speech to text (STT) engine for converting speech input into a text string or a natural language processing (NLP) engine for acquiring intention information of a natural language.

At least one of the STT engine or the NLP engine may be configured as an artificial neural network, at least part of which is learned according to the machine learning algorithm. At least one of the STT engine or the NLP engine may be learned by the learning processor 130, may be learned by the learning processor 240 of the AI server 200, or may be learned by their distributed processing.

The processor 180 may collect history information including the operation contents of the AI apparatus 100 or the user's feedback on the operation and may store the collected history information in the memory 170 or the learning processor 130 or transmit the collected history information to the external device such as the AI server 200. The collected history information may be used to update the learning model.

The processor 180 may control at least part of the components of AI device 100 so as to drive an application program stored in memory 170. Furthermore, the processor 180 may operate two or more of the components included in the AI device 100 in combination so as to drive the application program.

Figure 2:
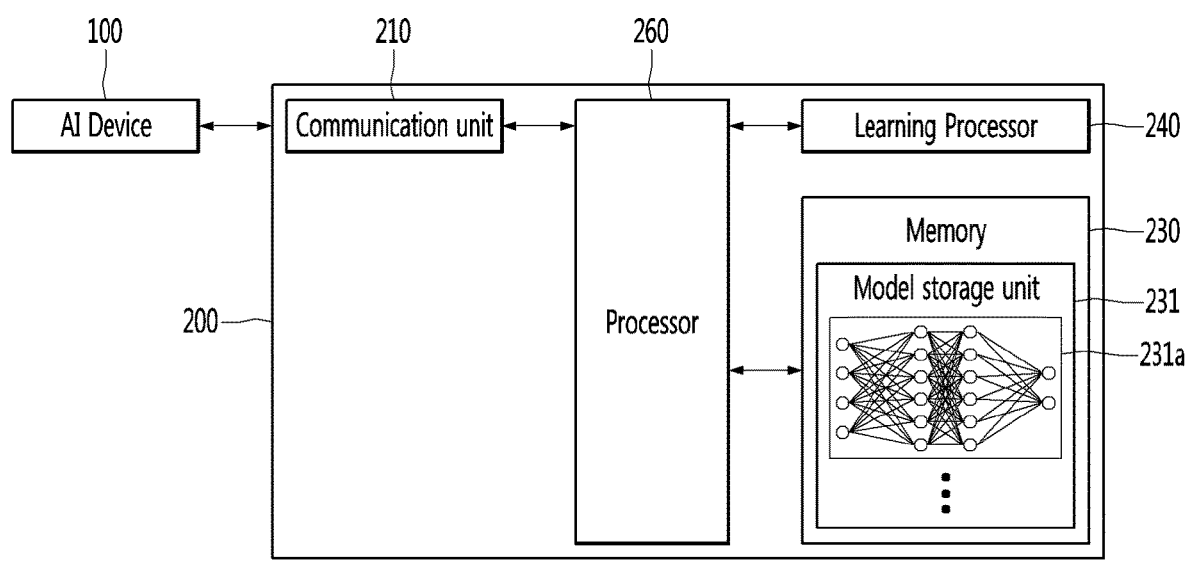
FIG. 2 illustrates an AI server according to an embodiment of the present disclosure.

FIG. 2 illustrates an AI server 200 according to an embodiment of the present invention.

Referring to FIG. 2, the AI server 200 may refer to a device that learns an artificial neural network by using a machine learning algorithm or uses a learned artificial neural network. The AI server 200 may include a plurality of servers to perform distributed processing, or may be defined as a 5G network. At this time, the AI server 200 may be included as a partial configuration of the AI device 100, and may perform at least part of the AI processing together.

The AI server 200 may include a communication unit 210, a memory 230, a learning processor 240, a processor 260, and the like.

The communication unit 210 can transmit and receive data to and from an external device such as the AI device 100.

The memory 230 may include a model storage unit 231. The model storage unit 231 may store a learning or learned model (or an artificial neural network 231a) through the learning processor 240.

The learning processor 240 may learn the artificial neural network 231a by using the learning data. The learning model may be used in a state of being mounted on the AI server 200 of the artificial neural network, or may be used in a state of being mounted on an external device such as the AI device 100.

The learning model may be implemented in hardware, software, or a combination of hardware and software. If all or part of the learning models are implemented in software, one or more instructions that constitute the learning model may be stored in memory 230.

The processor 260 may infer the result value for new input data by using the learning model and may generate a response or a control command based on the inferred result value.

Figure 3:
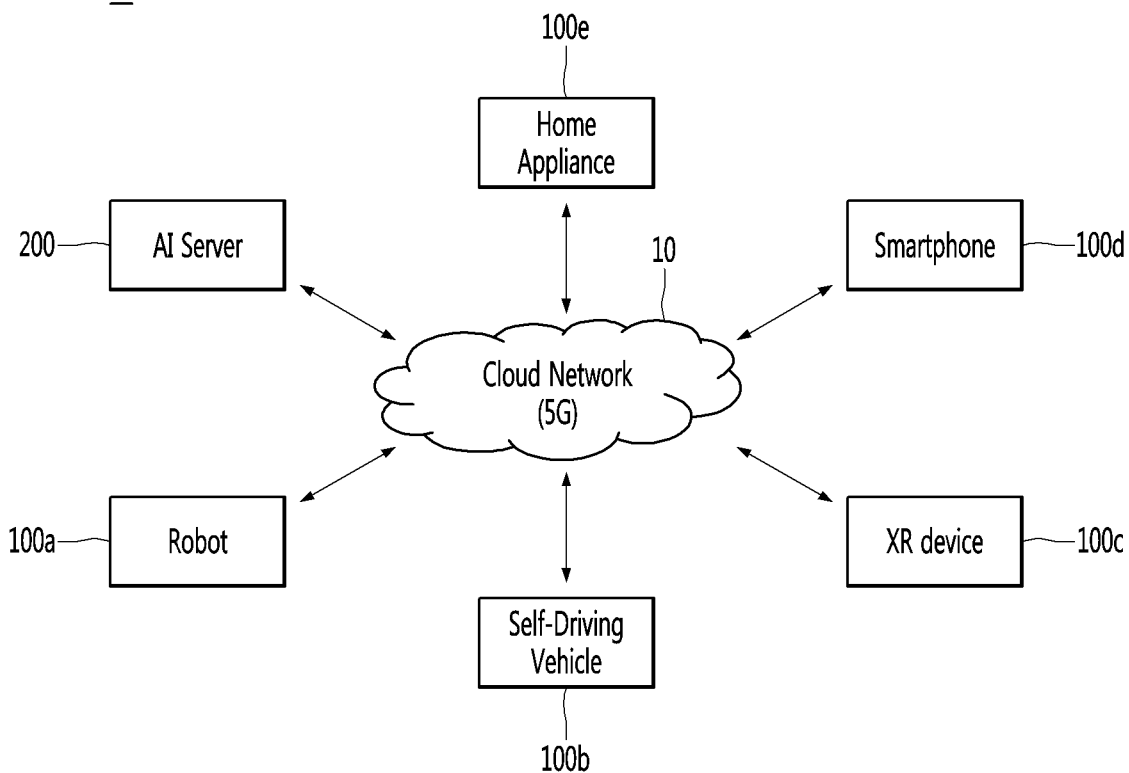
FIG. 3 illustrates an AI system according to an embodiment of the present disclosure.

FIG. 3 illustrates an AI system 1 according to an embodiment of the present invention.

Referring to FIG. 3, in the AI system 1, at least one of an AI server 200, a robot 100a, a self-driving vehicle 100b, an XR device 100c, a smartphone 100d, or a home appliance 100e is connected to a cloud network 10. The robot 100a, the self-driving vehicle 100b, the XR device 100c, the smartphone 100d, or the home appliance 100e, to which the AI technology is applied, may be referred to as AI devices 100a to 100e.

The cloud network 10 may refer to a network that forms part of a cloud computing infrastructure or exists in a cloud computing infrastructure. The cloud network 10 may be configured by using a 3G network, a 4G or LTE network, or a 5G network.

That is, the devices 100a to 100e and 200 configuring the AI system 1 may be connected to each other through the cloud network 10. In particular, each of the devices 100a to 100e and 200 may communicate with each other through a base station, but may directly communicate with each other without using a base station.

The AI server 200 may include a server that performs AI processing and a server that performs operations on big data.

The AI server 200 may be connected to at least one of the AI devices constituting the AI system 1, that is, the robot 100a, the self-driving vehicle 100b, the XR device 100c, the smartphone 100d, or the home appliance 100e through the cloud network 10, and may assist at least part of AI processing of the connected AI devices 100a to 100e.

At this time, the AI server 200 may learn the artificial neural network according to the machine learning algorithm instead of the AI devices 100a to 100e, and may directly store the learning model or transmit the learning model to the AI devices 100a to 100e.

At this time, the AI server 200 may receive input data from the AI devices 100a to 100e, may infer the result value for the received input data by using the learning model, may generate a response or a control command based on the inferred result value, and may transmit the response or the control command to the AI devices 100a to 100e.

Alternatively, the AI devices 100a to 100e may infer the result value for the input data by directly using the learning model, and may generate the response or the control command based on the inference result.

Hereinafter, various embodiments of the AI devices 100a to 100e to which the above-described technology is applied will be described. The AI devices 100a to 100e illustrated in FIG. 3 may be regarded as a specific embodiment of the AI device 100 illustrated in FIG. 1.

The robot 100a, to which the AI technology is applied, may be implemented as a guide robot, a carrying robot, a cleaning robot, a wearable robot, an entertainment robot, a pet robot, an unmanned flying robot, or the like.

The robot 100a may include a robot control module for controlling the operation, and the robot control module may refer to a software module or a chip implementing the software module by hardware.

The robot 100a may acquire state information about the robot 100a by using sensor information acquired from various kinds of sensors, may detect (recognize) surrounding environment and objects, may generate map data, may determine the route and the travel plan, may determine the response to user interaction, or may determine the operation.

The robot 100a may use the sensor information acquired from at least one sensor among the lidar, the radar, and the camera so as to determine the travel route and the travel plan.

The robot 100a may perform the above-described operations by using the learning model composed of at least one artificial neural network. For example, the robot 100a may recognize the surrounding environment and the objects by using the learning model, and may determine the operation by using the recognized surrounding information or object information. The learning model may be learned directly from the robot 100a or may be learned from an external device such as the AI server 200.

At this time, the robot 100a may perform the operation by generating the result by directly using the learning model, but the sensor information may be transmitted to the external device such as the AI server 200 and the generated result may be received to perform the operation.

The robot 100a may use at least one of the map data, the object information detected from the sensor information, or the object information acquired from the external apparatus to determine the travel route and the travel plan, and may control the driving unit such that the robot 100a travels along the determined travel route and travel plan.

The map data may include object identification information about various objects arranged in the space in which the robot 100a moves. For example, the map data may include object identification information about fixed objects such as walls and doors and movable objects such as pollen and desks. The object identification information may include a name, a type, a distance, and a position.

In addition, the robot 100a may perform the operation or travel by controlling the driving unit based on the control/interaction of the user. At this time, the robot 100a may acquire the intention information of the interaction due to the user's operation or speech utterance, and may determine the response based on the acquired intention information, and may perform the operation.

The XR device 100c, to which the AI technology is applied, may be implemented by a head-mount display (HMD), a head-up display (HUD) provided in the vehicle, a television, a mobile phone, a smartphone, a computer, a wearable device, a home appliance, a digital signage, a vehicle, a fixed robot, a mobile robot, or the like.

The XR device 100c may analyzes three-dimensional point cloud data or image data acquired from various sensors or the external devices, generate position data and attribute data for the three-dimensional points, acquire information about the surrounding space or the real object, and render to output the XR object to be output. For example, the XR device 100c may output an XR object including the additional information about the recognized object in correspondence to the recognized object.

The XR device 100c may perform the above-described operations by using the learning model composed of at least one artificial neural network. For example, the XR device 100c may recognize the real object from the three-dimensional point cloud data or the image data by using the learning model, and may provide information corresponding to the recognized real object. The learning model may be directly learned from the XR device 100c, or may be learned from the external device such as the AI server 200.

At this time, the XR device 100c may perform the operation by generating the result by directly using the learning model, but the sensor information may be transmitted to the external device such as the AI server 200 and the generated result may be received to perform the operation.

The robot 100a, to which the AI technology and the XR technology are applied, may be implemented as a guide robot, a carrying robot, a cleaning robot, a wearable robot, an entertainment robot, a pet robot, an unmanned flying robot, a drone, or the like.

The robot 100a, to which the XR technology is applied, may refer to a robot that is subjected to control/interaction in an XR image. In this case, the robot 100a may be separated from the XR device 100c and interwork with each other.

When the robot 100a, which is subjected to control/interaction in the XR image, may acquire the sensor information from the sensors including the camera, the robot 100a or the XR device 100c may generate the XR image based on the sensor information, and the XR device 100c may output the generated XR image. The robot 100a may operate based on the control signal input through the XR device 100c or the user's interaction.

For example, the user can confirm the XR image corresponding to the time point of the robot 100a interworking remotely through the external device such as the XR device 100c, adjust the self-driving travel path of the robot 100a through interaction, control the operation or driving, or confirm the information about the surrounding object.

Figure 4:
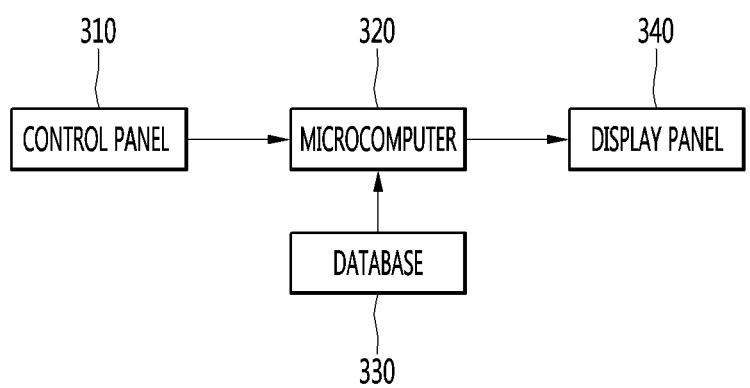
FIG. 4 illustrates one example of a robot simulator according to the present disclosure.

FIG. 4 illustrates one example of a robot simulator according to the present disclosure.

Hereinafter, the present disclosure will be described in limitation to a device, which serves as a simulator for a robot to work in an industrial site, to simulate a robot including a robot arm for allowing the mounting of a tool.

According to the present disclosure, the robot simulator 300 may include a control panel 310, a microcomputer 320, a database 330, and a display panel 340 as illustrated in FIG. 4.

The control panel 310 may receive an input value actually input by an operator and may transmit the input value to the microcomputer 320.

The type of a robot, the movement displacement of the robot, the type of a tool, the mounting position of the tool, or the movement displacement of the tool may be input to the control panel 310, but is not limited thereto.

In addition, the control panel 310 may be configured integrally with the display panel 340, which is to be described below, in a touch panel manner, but is limited thereto.

The microcomputer 320 may generate video information and reproduction information based on the input value input through the control panel 310 and data stored in the database 330, and may transmit the video information and the reproduction information to the display panel 340.

A three dimension (3D) image may be displayed on the display panel 340 based on the image information, and an animation formed as 3D images continuously move may be displayed on the display panel 340 based on the reproduction information.

The database 330 may store various pieces of data such as data on a robot linked with a simulator, data on a tool, a tool coordinate system, or a VR image, in addition to data on a real working environment, and may transmit the relevant data to the microcomputer 340 if necessary.

In this case, the data on the real working environment may be input through a separate video device, camera, or vision system, may be stored in the database 330 or may be directly transmitted to a microcomputer 320.

The display panel 340 may display a real image of the robot and the tool, in the form of a 3D image, in response to an image signal and a reproduction signal received from the microcomputer 320, or may display the real image of the robot and the tool to be overlapped with the tool coordinate system and the VR image at the end effector of the robot arm.

Figure 5:
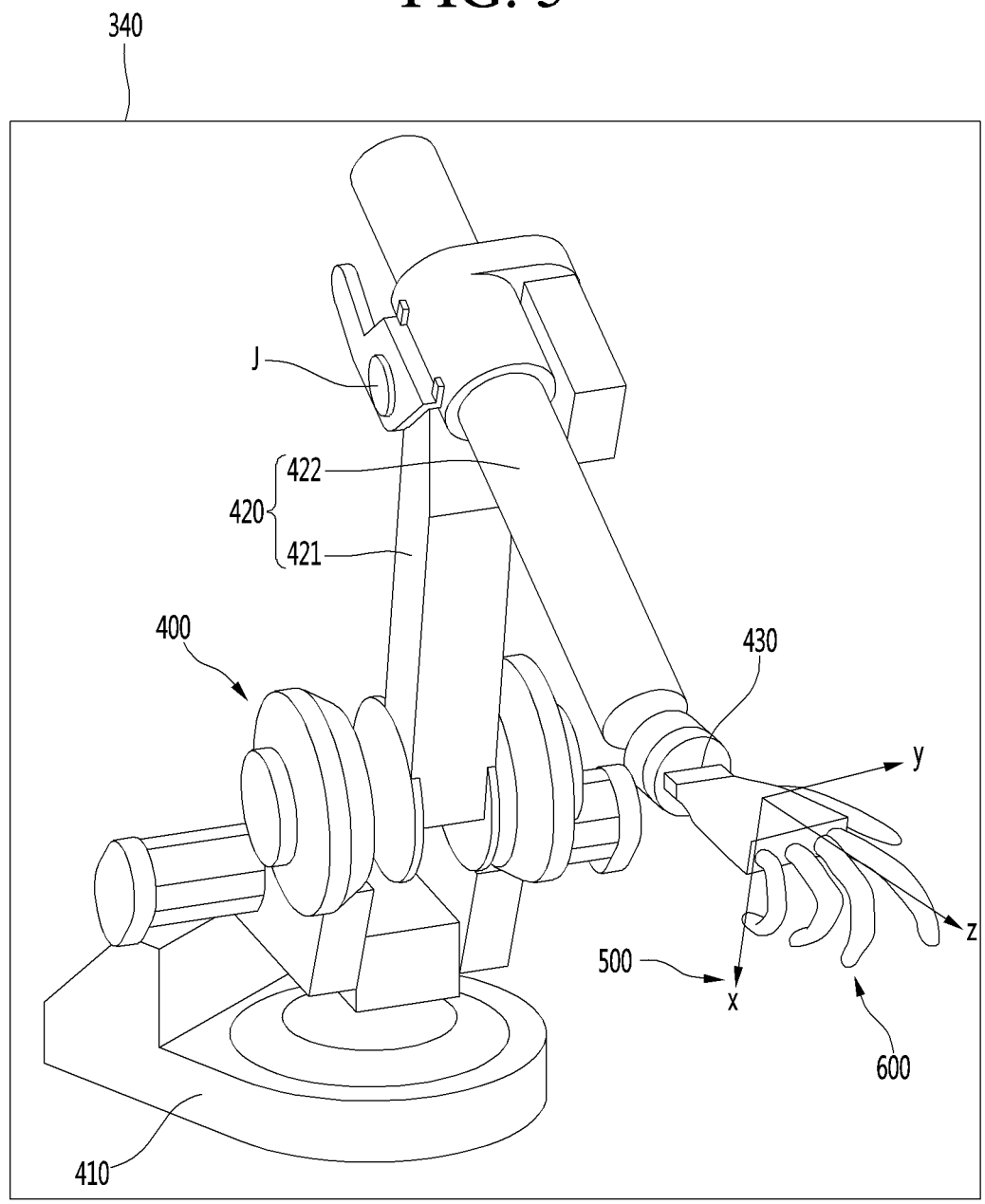
FIG. 5 is a view illustrating a screen displayed on a robot simulator panel according to a first embodiment of the present disclosure.

FIG. 5 is a view illustrating a screen displayed on a robot simulator panel according to a first embodiment of the present disclosure.

According to the first embodiment of the present disclosure, the robot simulator 300, which is a device to simulate a robot to mount only one tool, may display, on the display panel 340, a tool coordinate system 500 and a virtual reality image 600 together with a robot image 400.

The robot image 400, which is implemented in the shape of forming a real robot, may include a base 410, a robot arm 420 provided on the base 410 to move with a preset degree of freedom, and an end effector 430 which is provided at an end portion of the robot arm 420 to mount the tool.

The robot arm 420 may be configured in the structure in which a plurality of links 421 and 422 are linked with each other through a plurality of joints J. In addition, as the joints J are rotated by a driving motor, the movements of the links may be adjusted, and the end effector 430 may be moved to a working position.

The end effect 430 may be equipped with a gripper, a sensor, or a tool changer, but is not limited thereto.

The tool coordinate system 500, which is a coordinate system for marking the direction of the tool, may be provided at the end effector 430. The tool coordinate system 500 may be represented by X, Y, and Z axes that are orthogonal to each other in three dimensions.

The VR image 600, which is an image for intuitively displaying the direction of the tool, may be provided at the end effector 430 provided to mount the tool. The VR image 600 may be displayed in the form of a friendly three-dimensional hand image, but is not limited thereto.

At least a portion of the VR image 600 may be displayed to overlap with the tool coordinate system 500. In this case, the VR image 600 and the tool coordinate system 500 have to be displayed such that the directions of the tool coordinate system 500 and the VR image 600 are recognized. The VR image 600 may be displayed to be linked with the movement of the tool, but is not limited thereto.

The tool coordinate system 500 and at least a portion of the VR image 600 may be displayed to overlap with a tool image. In this case, the VR image 600 and the tool coordinate system 500 have to be displayed such that the movement of the tool is recognized.

For example, both the tool coordinate system 500 and the VR image 600 may be transparently displayed In addition, the tool coordinate system 500 and the VR image 600 may be displayed opaquely, and, in this case, have to be displayed such that the directions of the tool coordinate system 500 and the VR image 600 are recognized. In other words, the tool coordinate system 500, which is smaller, may be displayed to be placed in front of the VR image 600 which is larger.

In addition, one of the tool coordinate system 500 and the VR image 600 may be displayed obliquely, and a remaining one may be displayed transparently.

Figure 6A:
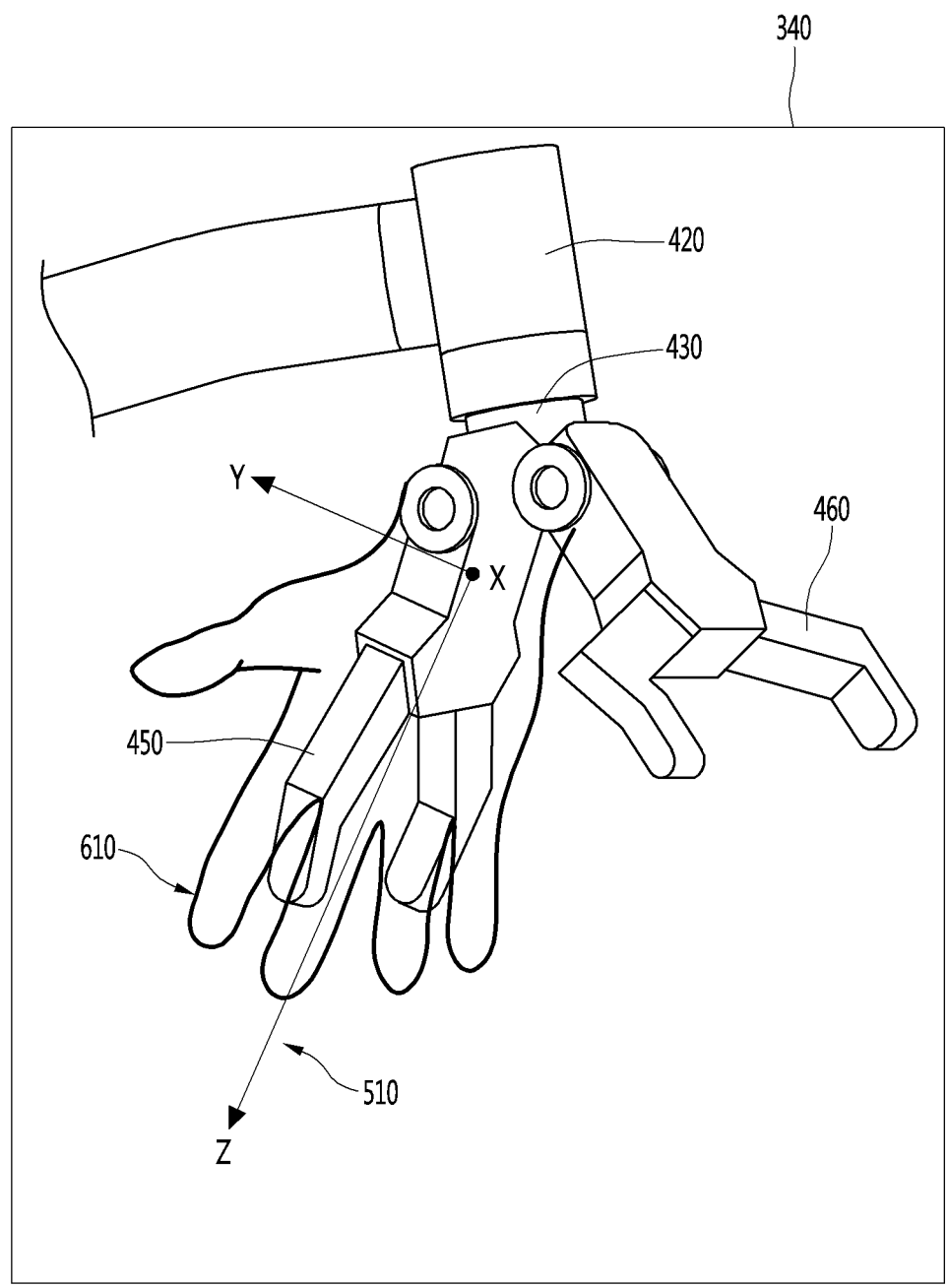
FIG. 6A and FIG. 6B are views illustrating a screen displayed on a robot simulator panel according to a second embodiment of the present disclosure.
Figure 6B:
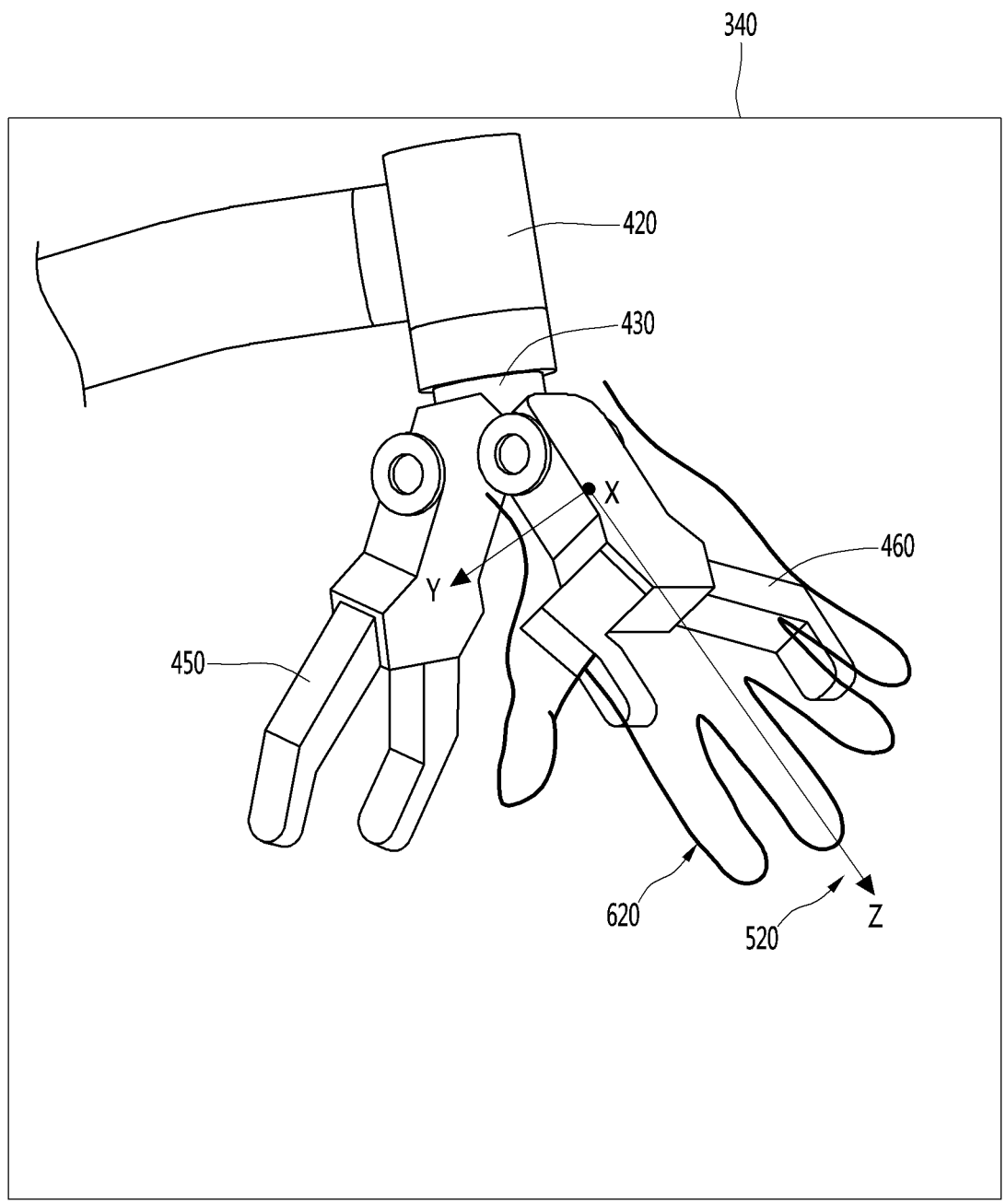

FIG. 6A and FIG. 6B are views illustrating a screen displayed on the robot simulator panel according to a second embodiment of the present disclosure.

According to the second embodiment of the present disclosure, the robot simulator 300 is a device to simulate a robot to mount first and second tools 450 and 460. The first and second tools 450 and 460 may be simultaneously mounted at the end effector 430, and first and second coordinate systems 510 and 520 and first and second VR images 610 and 620 may be displayed, on the display panel 340, in the form of a 3D image at the positions, at which the first and second tools 450 and 460 are mounted, of the end effector 430.

An operator may input the first and second tools 450 and 460 to mount the robot into the side of the robot simulator, and the first and second tools 450 and 460 may include various types of tools, but is not limited thereto.

The operator may select the first and second tools 450 and 460 through the display panel 340, and the robot simulator may display, on the display panel 340, only the relevant tool system and the relevant VR image corresponding at the mounting position of the selected tool.

If the first tool 450 is selected, as illustrated in FIG. 6A, only a first tool coordinate system 510 and a first VR image 610 are displayed at the mounting position of the first tool 450 together with the first and second tools 450 and 460, and a second tool coordinate system 520 and a second VR image 620 may not be displayed.

If the second tool 460 is selected, as illustrated in FIG. 6B, the first tool coordinate system 510 and the first VR image 610 may be not displayed and only the second tool coordinate system 520 and the second VR image 620 may not be displayed at the mounting position of the second tool 460 together with the first and second tools 450 and 460.

In addition, the first and second tool coordinate systems 510 and 520 and the first and second VR images 610 and 620 may be displayed transparently or opaquely, and in this case, have to be displayed such that the first and second tool coordinate systems 510 and 520 and the first and second VR images 610 and 620 are recognized.

Figure 7:
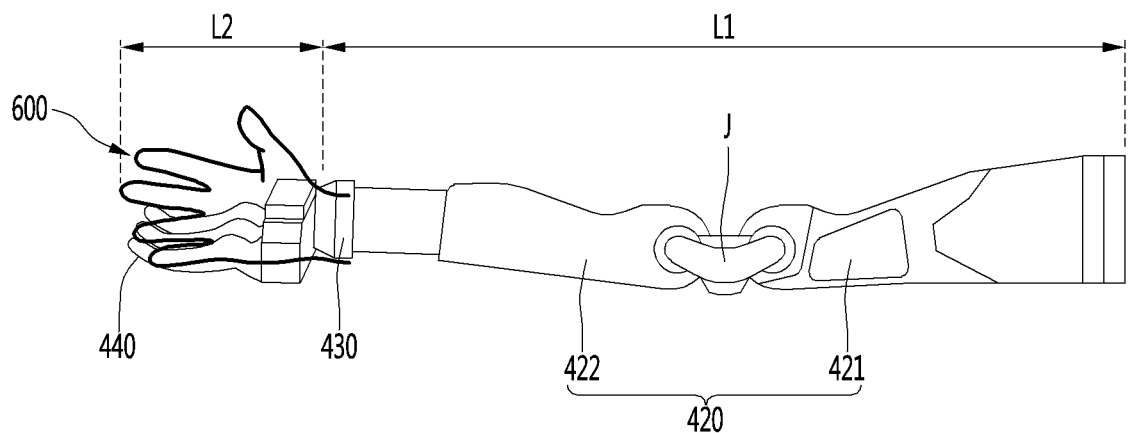
FIG. 7 is a view illustrating that the size of a hand image is set based on a robot arm in a robot simulator according to the present disclosure.

FIG. 7 is a view illustrating that the size of a hand image is set based on a robot arm in the robot simulator according to the present disclosure.

In the VR image 600 according to the present disclosure, a hand image is employed such that the operator may intuitively recognize the working direction through the hand image familiar to the operator.

The hand image 600 is displayed at the end effector 430 which is an end portion of the robot arm 420. The hand image 600 may include five fingers, a palm, and a back of a hand without change.

The length L2 of the hand image 600 may be calculated based on the whole length L1+L2 of the robot arm 420 including the tool 440, in which the entire portion of the robot arm 420 including the tool 440 may be regarded from the shoulder of the human being to the tip of the hand and the hand image 600 may be regarded as being a hand.

The length L2 of the hand image 600 may be configured to be shorter than the whole length L1+L2 of the robot arm 420, and is equal to or longer than the length of the tool 440.

When considering the proportion of a human body, that is, that the length of the hand is maintained to be about 25% of the arm length, the length of the hand image 600 is preferably configured to become 20-25% of the whole length of the robot arm 420. The hand image 600 of the robot arm 420 may be naturally displayed with the proportion similar to that of the human being.

Figure 8:
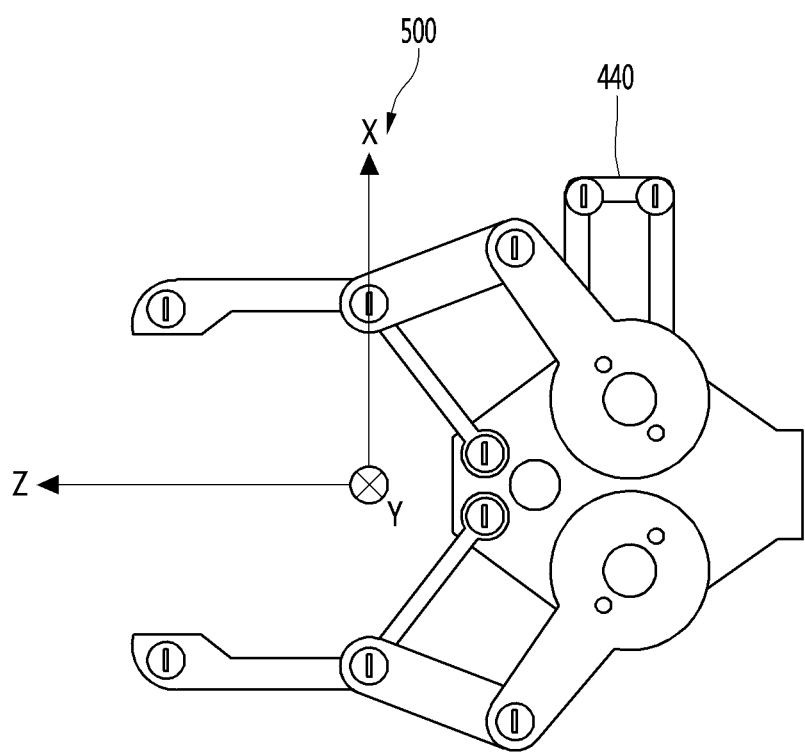
FIG. 8 is a view illustrating that a tool coordinate system is set based on a gripper in a robot simulator according to the present disclosure.
Figure 9:
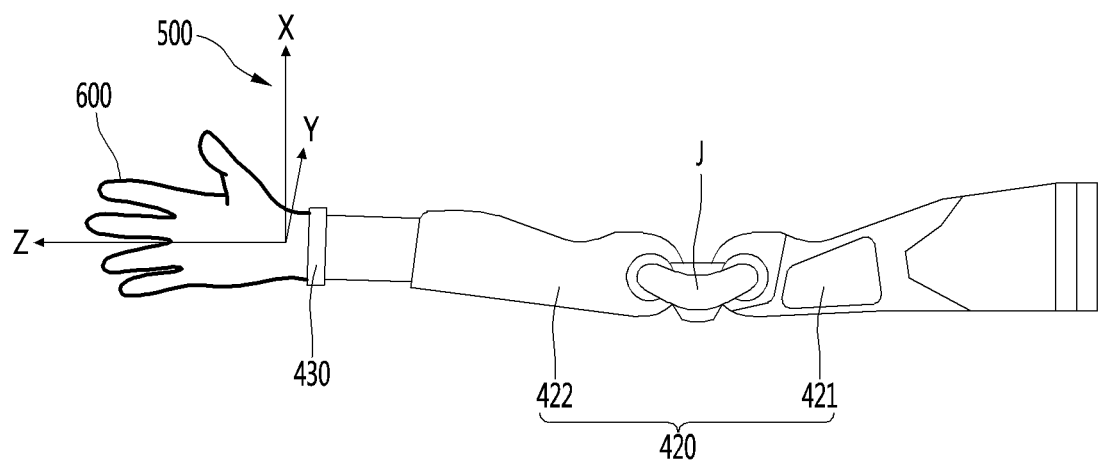
FIG. 9 is a view illustrating that a tool coordinate system is set based on a robot arm in a robot simulator according to the present disclosure.
Figure 10:
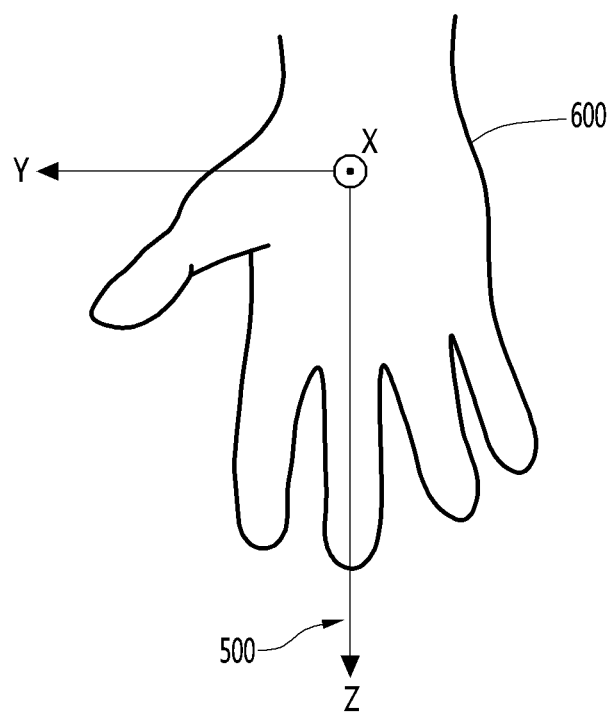
FIG. 10 is a view illustrating that a hand image is set based on a tool coordinate system in a robot simulator according to the present intention.

FIG. 8 is a view illustrating that a tool coordinate system is set based on a gripper in the robot simulator according to the present disclosure, FIG. 9 is a view illustrating that the tool coordinate system is set based on the robot arm in the robot simulator according to the present disclosure, and FIG. 10 is a view illustrating that a hand image is set based on the tool coordinate system in the robot simulator according to the present intention.

The robot simulator of the present disclosure will be described based on the simulation of the robot having a gripper 440 mounted at the end effector 430 of the robot arm 420.

The robot simulator of the present disclosure displays, on the display panel, the tool coordinate system 500 and the hand image 600 together with the robot. Hereinafter, the procedure of setting positions of the tool coordinate system 500 and the hand image 600 will be described.

First, as illustrated in FIG. 8, a tool coordinate system 550 may be set based on the gripper 440.

According to an embodiment, a Z axis may be set in a lengthwise direction of the gripper 440.

In this case, a Y-axis and a Z-axis may be directly set by the operator according to the right hand rule.

However, as illustrated in FIG. 9, the X-axis may be set such that the tool coordinate system 500 is matched to the direction of the robot arm 420.

According to an embodiment, the Z axis may be set to be the lengthwise direction of the gripper 400, that is, the direction that the end effector 430 indicates when the robot arm 420 is fully spread as described above.

In addition, the X axis may be set to be a direction that a joint J closest to the end effector 430 of the robot arm 420 is folded.

In this case, the Y axis may be automatically set to be perpendicular to the X axis according to the right hand rule.

As described above, the tool coordinate system 500 may be set at the end effector 430 based on the gripper 440 and the robot arm 420.

Thereafter, as illustrated in FIGS. 9 and 10, the hand image 600 may be set such that the direction of the hand image 600 is matched to the tool coordinate system 500.

According to an embodiment, the direction that the palm of the hand image 600 faces may be matched to the X axis, the direction that the thumb of the hand image 600 faces may be matched to the Y axis, and the direction that the remaining fingers of the hand image 600 except for the thumb face may be matched to the Z axis.

Accordingly, the tool coordinate system 500 and the hand image 600 may be displayed simultaneously at the end effector 430 of the robot arm 420, at which the gripper 440 may be mounted, and the operator may intuitively recognize the working direction through the tool coordinate system 500 and the hand image 600.

Figure 11:
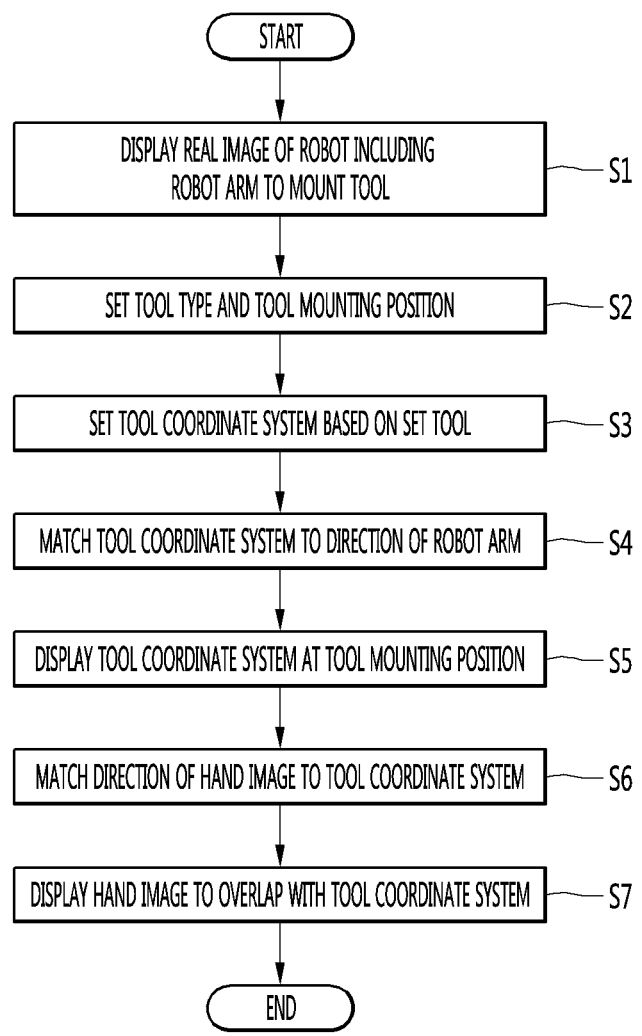
FIG. 11 is a flowchart illustrating a displaying method of a robot simulator according to an embodiment of the present disclosure.

FIG. 11 is a flowchart illustrating a displaying method of a robot simulator according to an embodiment of the present disclosure.

A real image of the robot may be displayed (see S1).

The robot is a robot to mount a tool at an end effector of a robot arm, and the robot and the surrounding environment of the robot may be displayed in the form of an image or a video by reflecting data which is previously input.

The type of the tool and the tool mounting position are set and then the tool coordinate system may be set based on the set tool (see S2 and S3).

When the type of the tool is set to a gripper, a Z axis may be set to the lengthwise direction of the gripper, and an X axis may be set to a direction perpendicular to a jigging direction of the gripper. In addition, when the X axis and the Z axis are set, the Y axis may be set according to the right hand rule.

The tool mounting position may be the end effector of the robot arm. When a plurality of tools are mounted, one of a plurality of tool mounting positions may be selected.

Then, the tool coordinate system may be matched with the direction of the robot arm, and the tool coordinate system may be displayed at the tool mounting position (see S4 and S5).

The Z axis is set to face the longitudinal direction of the gripper, that is, to face the end effector of the robot arm. The X axis may be set to be a direction that the joint closest to the end effector of the robot arm is folded. Similarly, when the X axis and the Z axis are set, the Y axis may be set to be match to the direction of the robot arm according to the right hand rule.

When the tool coordinate system is matched to the direction of the robot arm, the tool coordinate system may be displayed at the tool mounting position selected above.

Then, the direction of the hand image may be matched with the tool coordinate system and the hand image may be displayed to overlap with the tool coordinate system (see S6 and S7).

The X axis may be matched to the direction that the palm of the hand image faces, the Y axis may be matched to the direction that the thumb of the hand image 600 indicates, and the Z axis may be matched to the direction that the remaining fingers of the hand image except for the thumb face.

As described, the relationship in position among the robot arm, the tool, the tool coordinate system, and the hand image may be set based on the relationship among them. The tool coordinate system and the hand image may be simultaneously displayed at the end effector of the robot arm.

While the present disclosure has been described with reference to exemplary embodiments, it will be apparent to those skilled in the art that various changes and modifications may be made without departing from the spirit and scope of the present disclosure.

Therefore, the exemplary embodiments of the present disclosure are provided to explain the spirit and scope of the present disclosure, but not to limit them, so that the spirit and scope of the present disclosure is not limited by the embodiments.

The scope of the present disclosure should be construed on the basis of the accompanying claims, and all the technical ideas within the scope equivalent to the claims should be included in the scope of the present disclosure.

What is claimed is:

1. A displaying method on a robot simulator, the displaying method comprising:
   displaying an image of a robot to mount a tool at an end effector of a robot arm;
   displaying a tool coordinate system indicating an operating direction of the tool at the end effector of the robot arm which is displayed in the displaying of the image of the robot; and
   displaying a virtual reality (VR) image having a three-dimensional image at the end effector of the robot arm which is displayed in the displaying of the image of the robot,
   wherein the displaying of the VR image includes:
     displaying the VR image in a form of a hand image to intuitively display a working direction of the tool,
   wherein the displaying of the VR image includes:
     displaying the hand image so that the hand image overlaps with at least a portion of the tool coordinate system,
   wherein the displaying of the tool coordinate system includes:
     displaying the tool coordinate system with an X axis, a Y axis, and a Z axis perpendicular to one another in a three dimensional space,
   wherein the displaying of the tool coordinate system includes:
     setting the Z axis to be a lengthwise direction of the tool,
   wherein the displaying of the VR image further includes:
     matching the tool coordinate system to a direction of the hand image,
   wherein the matching of the tool coordinate system to the direction includes:
     displaying, as the X axis, a direction that a palm of the hand image indicates;
     displaying, as the Y axis, a direction that a thumb of the hand image indicates; and
     displaying, as the Z axis, a direction that remaining fingers of the hand image except for the thumb indicate.

2. The display method of claim 1, wherein the displaying of the VR image includes:
   displaying the VR image having a length shorter than a whole length of the robot arm.

3. The displaying method of claim 2, wherein the displaying of the VR image includes:
   displaying the VR image having the length corresponding to 20-25% of the whole length of the robot arm.

4. The displaying method of claim 1, wherein the displaying of the VR image includes:
   displaying the VR image having a length equal to or longer than a length of the tool mounted on the robot arm.

5. The displaying method of claim 1, wherein the displaying of the VR image includes:

displaying the VR image so that at least a portion of the VR image overlaps with at last a portion of the tool.

6. The displaying method of claim 1, wherein the displaying of the VR image includes:
displaying the VR image to be linked with the movement of the tool.

7. The displaying method of claim 1, wherein the displaying of the tool coordinate system further includes:
matching the tool coordinate system to a direction of the robot arm.

8. The displaying method of claim 7, wherein the matching of the tool coordinate system to the direction of the robot arm includes:
displaying the X axis in a direction that a joint closest to the end effector of the robot arm is folded;
displaying the Z axis in a direction that the end effector of the robot arm indicates; and
displaying the Y axis in a direction perpendicular to the X and Y axes.

9. The displaying method of claim 1, wherein the displaying of the image includes:
displaying the end effector of the robot arm to mount a plurality of tools;
wherein the displaying of the tool coordinate system indicating the operating direction of the tool includes:
displaying tool coordinate systems at mounting positions of the tools, respectively, at the end effector of the robot arm which is displayed in the displaying of the image; and
wherein the displaying of the VR image includes:
displaying VR images at the mounting positions of the tools, respectively, at the end effector of the robot arm which is displayed in the displaying of the image.

10. The displaying method of claim 9, further comprising:
selecting one of the tools to be mounted in the displaying of the image;
wherein the displaying of the tool coordinate system indicating the operating direction of the tool includes:
displaying only one of the tool coordinate systems at an end effector position, at which the selected tool is to be mounted in the selecting of one of the tools, of the robot arm.

11. The displaying method of claim 9, further comprising:
selecting one of the tools to be mounted in the displaying of the image;
wherein the displaying of the VR image includes:
displaying only one of the VR images at an end effector position, at which the selected tool is to be mounted in the selecting of one of the tools, of the robot arm.

12. The displaying method of claim 11, wherein the displaying of the VR image includes:
displaying the VR image so that the VR image overlaps with at last a portion of the tool.

13. The displaying method of claim 11, wherein the displaying of the VR image includes:
displaying the VR image to be linked with the movement of the tool.

14. The displaying method of claim 11, wherein the displaying of the VR image includes:
displaying the VR image so that at least a portion of the VR image overlaps with the tool coordinate system.

* * * * *